(12) United States Patent
Chandolu et al.

(10) Patent No.: US 10,566,241 B1
(45) Date of Patent: Feb. 18, 2020

(54) METHODS OF FORMING A SEMICONDUCTOR DEVICE, AND RELATED SEMICONDUCTOR DEVICES AND SYSTEMS

(71) Applicant: Micron Technology, Inc., Boise, ID (US)

(72) Inventors: Anilkumar Chandolu, Boise, ID (US); Matthew J. King, Boise, ID (US); Indra V. Chary, Boise, ID (US); Darwin A. Clampitt, Wilder, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/194,926

(22) Filed: Nov. 19, 2018

(51) Int. Cl.
*H01L 21/8234* (2006.01)
*H01L 27/11556* (2017.01)

(52) U.S. Cl.
CPC ........ *H01L 21/823418* (2013.01); *H01L 21/823487* (2013.01); *H01L 27/11556* (2013.01)

(58) Field of Classification Search
CPC ....... H01L 21/823418; H01L 27/11556; H01L 21/823487
See application file for complete search history.

(56) References Cited

U.S. PATENT DOCUMENTS

| 9,741,737 | B1 | 8/2017 | Huang et al. |
| 2011/0256718 | A1 | 10/2011 | Haukka et al. |
| 2016/0163726 | A1 | 6/2016 | Tanzawa |
| 2016/0329343 | A1* | 11/2016 | Pachamuthu ..... H01L 27/11582 |
| 2017/0011996 | A1* | 1/2017 | Lee ..................... H01L 27/1157 |
| 2017/0148811 | A1* | 5/2017 | Zhang ............... H01L 27/11575 |
| 2017/0200801 | A1 | 7/2017 | Hopkins et al. |
| 2017/0352704 | A1 | 12/2017 | Simsek-Ege |
| 2018/0108669 | A1 | 4/2018 | Zhu et al. |

* cited by examiner

*Primary Examiner* — Selim U Ahmed
(74) *Attorney, Agent, or Firm* — TraskBritt

(57) ABSTRACT

A method of forming a semiconductor device comprises forming sacrificial structures and support pillars. The sacrificial structures comprise an isolated sacrificial structure in a slit region and connected sacrificial structures in a pillar region. Tiers are formed over the sacrificial structures and support pillars, and a portion of the tiers are removed to form tier pillars and tier openings, exposing the connected sacrificial structures and support pillars. The connected sacrificial structures are removed to form a cavity, a portion of the cavity extending below the isolated sacrificial structure. A cell film is formed over the tier pillars and over sidewalls of the cavity. A fill material is formed in the tier openings and over the cell film. A portion of the tiers in the slit region is removed, exposing the isolated sacrificial structure, which is removed to form a source opening. The source opening is connected to the cavity and a conductive material is formed in the source opening and in the cavity. Semiconductor devices and systems are also disclosed.

27 Claims, 10 Drawing Sheets

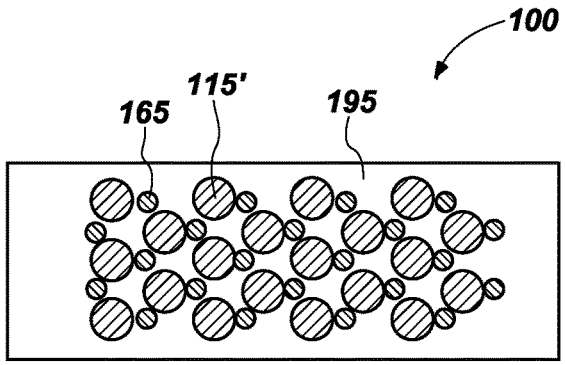
FIG. 5B1
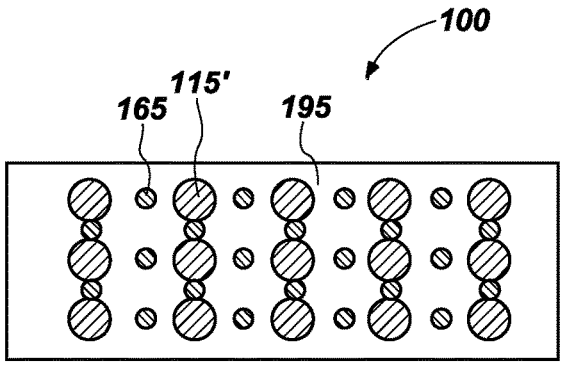
FIG. 5B2
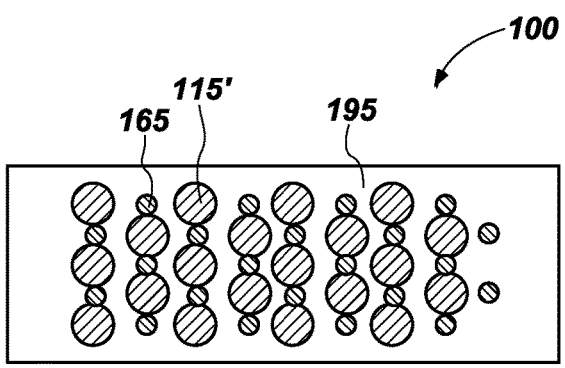
FIG. 5B3
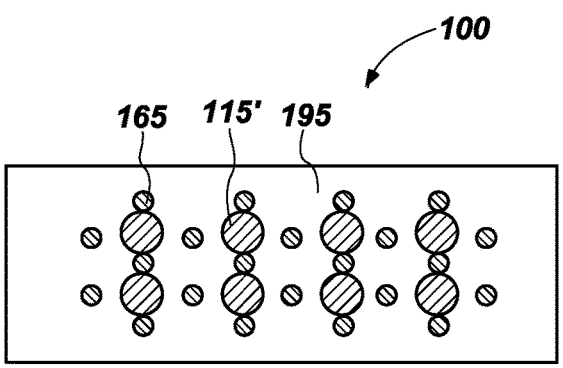
FIG. 5B4
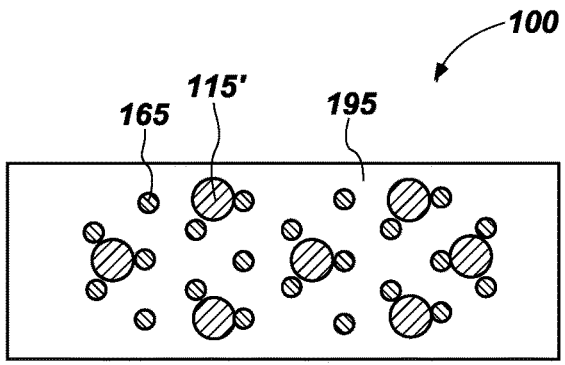
FIG. 5B5
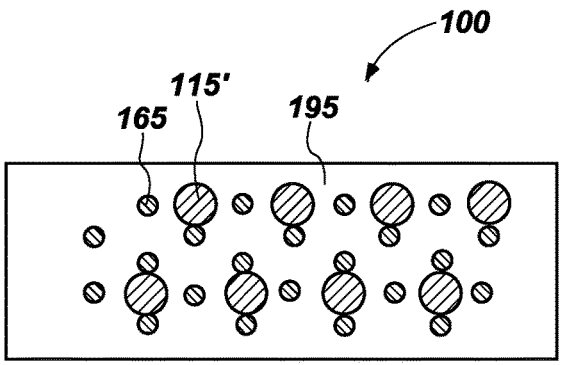
FIG. 5B6

METHODS OF FORMING A SEMICONDUCTOR DEVICE, AND RELATED SEMICONDUCTOR DEVICES AND SYSTEMS

CROSS-REFERENCE TO RELATED APPLICATION

This application is related to U.S. patent application Ser. No. 16/194,946, filed Nov. 19, 2018, pending, entitled "METHODS OF FORMING A SEMICONDUCTOR DEVICE, AND RELATED SEMICONDUCTOR DEVICES AND SYSTEMS" and filed on even date herewith, and assigned to the Assignee of the present application, the entire disclosure of which is hereby incorporated herein in its entirety by this reference.

TECHNICAL FIELD

Embodiments disclosed herein relate to semiconductor devices and fabrication of the semiconductor devices. More particularly, embodiments of the disclosure relate to methods of forming a semiconductor device and to related memory devices and systems.

BACKGROUND

Semiconductor device designers often desire to increase the level of integration or density of features within a semiconductor device by reducing the dimensions of the individual features and by reducing the distance between neighboring features. In addition, semiconductor device designers often desire to design architectures that are not only compact, but offer performance advantages, as well as simplified designs. A continuing goal of the semiconductor industry has been to increase the memory density (e.g., the number of memory cells per memory die) of memory devices, such as non-volatile memory devices (e.g., NAND Flash memory devices). One way of increasing memory density in non-volatile memory devices is to implement vertical memory array (also referred to as a "three-dimensional (3D) memory array") architectures. A conventional vertical memory array includes memory cell pillars extending through tiers of alternating conductive structures and insulative structures, with the conductive structures functioning as control gates. The memory cell pillars include a channel region positioned between a source region and a drain region. The configuration permits a greater number of electrical components (e.g., transistors) to be located in a unit of die area by building the array upwards (e.g., longitudinally, vertically) on a die, as compared to structures with conventional planar (e.g., two-dimensional) arrangements of electrical components.

To apply a potential to the memory device, a doped silicon wafer or an electrically conductive material above an interconnect is used as a source. To electrically connect the channel regions of the memory cells to the source, a so-called "pillar punch" etch process is conducted for each deck of tiers. A sacrificial polysilicon material is formed over a cell material to protect the cell material during the subsequently-conducted pillar punch etch process, which removes the sacrificial polysilicon material and underlying cell material at a bottom of the memory cell pillars. After conducting the pillar punch etch, the remaining sacrificial polysilicon material is removed, and channel material is formed over the cell material. In memory devices including multiple decks of tiers, a pillar punch etch process is conducted for each deck for proper alignment. However, as aspect ratios of the memory cell pillars continue to increase, alignment issues between the decks of tiers makes the pillar punch etch challenging.

BRIEF DESCRIPTION OF THE DRAWINGS

FIGS. 2B, 3B, 4B, 5B, 5B1-5B6, 6B, and 7B are top down views showing various stages of fabrication of the source of the semiconductor device in accordance with embodiments of the disclosure;

DETAILED DESCRIPTION

Figure 1A:
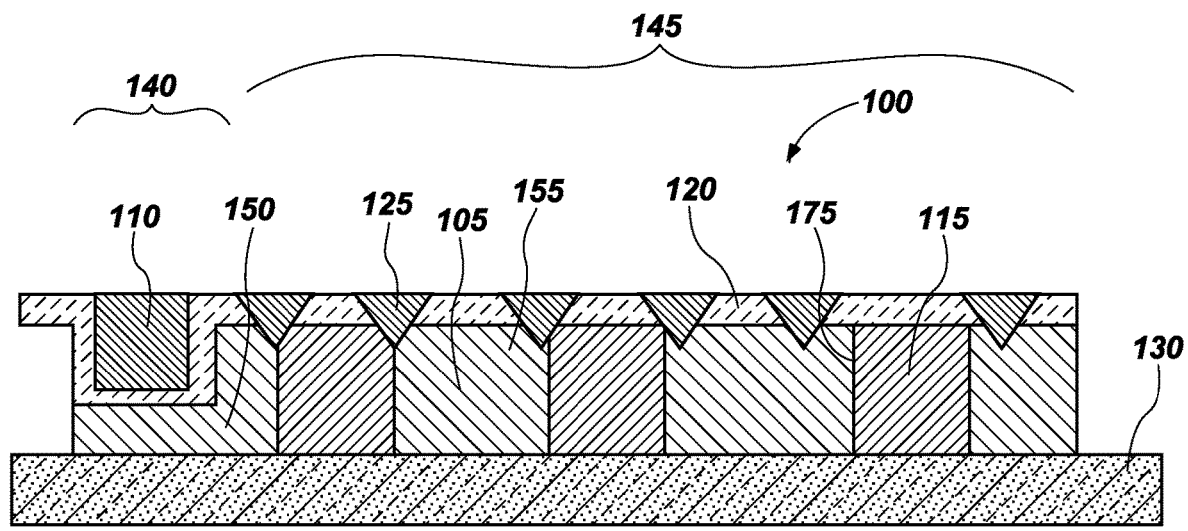
FIGS. 1A, 2A, 3A, 4A, 5A, 6A, and 7A are cross-sectional views showing various stages of fabrication of a source of a semiconductor device in accordance with embodiments of the disclosure.

A semiconductor device, such as a memory device, is disclosed, as are methods of forming a semiconductor device containing a source and systems containing the source. The source formed according to embodiments of the disclosure is surrounded by cell films (e.g., cell materials and channel materials) of memory cells of the semiconductor device, eliminating the necessity of conducting a pillar punch etch act to electrically connect the cell materials and channel materials of the memory cells to the source. The source is positioned below the memory cells and is in electrical contact with (e.g., electrically coupled to) the cell materials and channel materials of the memory cells. The methods according to embodiments of the disclosure are used to form three-dimensional (3D) semiconductor devices, such as 3D NAND Flash memory devices, which include, but are not limited to, 3D floating gate NAND Flash memory devices or 3D replacement gate NAND Flash memory devices. The source functions to apply a constant potential during use and operation of the 3D semiconductor devices.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor device or a complete process flow for manufacturing the semiconductor device and the structures described below do not form a complete semiconductor device. Only those process acts and structures necessary to understand the embodiments described herein are described in detail below. Additional acts to form a complete semiconductor device may be performed by conventional techniques.

The materials described herein may be formed by conventional techniques including, but not limited to, spin coating, blanket coating, chemical vapor deposition (CVD), atomic layer deposition (ALD), plasma enhanced ALD, or physical vapor deposition (PVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, the term "pitch" refers to the distance between identical points in two adjacent (i.e., neighboring) features.

As used herein, the term "selectively etchable" means and includes a material that exhibits a greater etch rate responsive to exposure to a given etch chemistry relative to another material exposed to the same etch chemistry. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the term "semiconductor device" includes without limitation a memory device, as well as other semiconductor devices which may or may not incorporate memory, such as a logic device, a processor device, or a radiofrequency (RF) device. Further, a semiconductor device may incorporate memory in addition to other functions such as, for example, a so-called "system on a chip" (SoC) including a processor and memory, or a semiconductor device including logic and memory.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a base material or construction upon which additional materials are formed. The substrate may be a semiconductor substrate, a base semiconductor layer on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

Figure 1B:
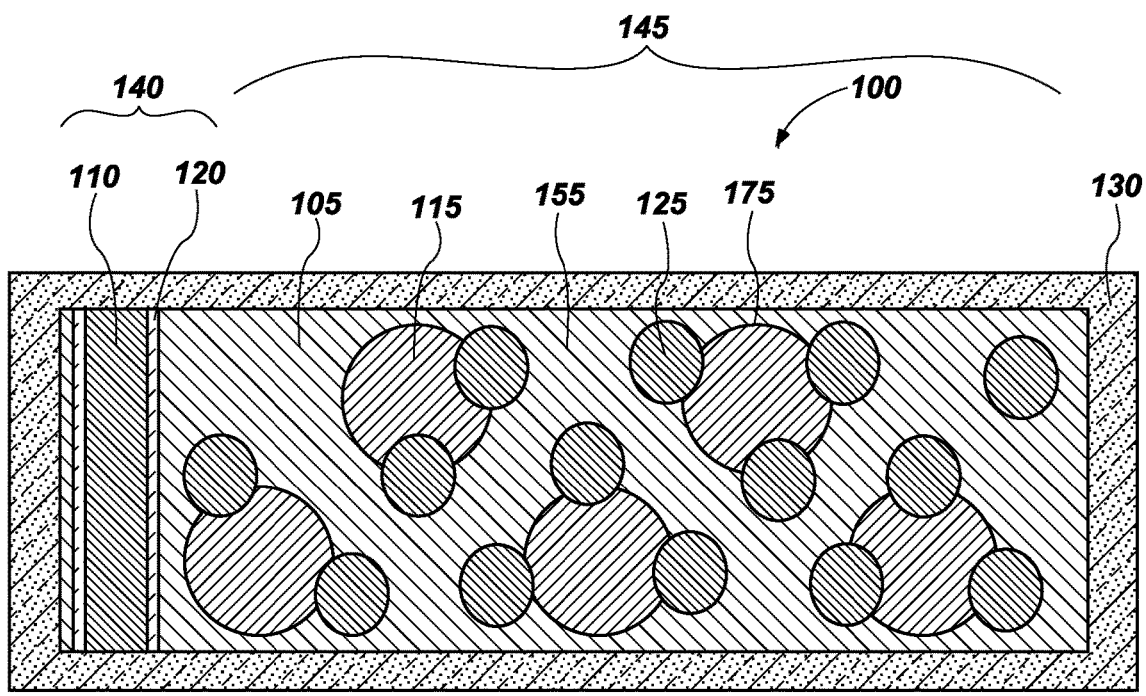

A semiconductor structure 100 including connected sacrificial structures 105, isolated sacrificial structure 110, support pillars 115, oxide material 120, and optional sacrificial plugs 125 on an insulative material 130 are shown in FIGS. 1A and 1B. The insulative material 130 may be formed over an electrically conductive material (not shown) configured to, for example, route signals to and/or from the electrically conductive material, which in turn is formed on or over a substrate (not shown). The substrate may include multiple portions that support and/or isolate one or more other conductive materials and insulative materials for routing the signals to and/or from the electrically conductive material. For example, the substrate may include one or more conductive materials where circuitry (e.g., control units,) and/or interconnections are provided for routing the signals. The locations of the connected sacrificial structures 105 and the isolated sacrificial structure 110 substantially correspond to the location of source 135 (see FIGS. 7A and 7B) ultimately to be formed, as described below.

A sacrificial material is formed over the insulative material 130 by conventional techniques and patterned by conventional techniques to form the connected sacrificial structures 105 and the isolated sacrificial structure 110. As shown in the cross-sectional view, the connected sacrificial structures 105 are separated from one another by the support pillars 115, and the isolated sacrificial structure 110 is separated from the connected sacrificial structures 105 by the oxide material 120. As shown in the top down view, the connected sacrificial structures 105 are separated from the isolated sacrificial structure 110 by the oxide material 120. The isolated sacrificial structure 110 is formed in a slit region 140 of the semiconductor structure 100 and the connected sacrificial structures 105 are formed in a pillar region 145 of the semiconductor structure 100.

The sacrificial material is selected to function as an etch stop and to be selectively removable relative to a material of the support pillars 115 as described below. The sacrificial material is also available at a relatively low cost since the material is eventually removed (e.g., sacrificial). The sacrificial material may include, but is not limited to, a silicon oxide ($SiO_x$), a metal oxide, such as aluminum oxide ($AlO_x$), or a metal, such as tungsten (W). In some embodiments, the sacrificial material is aluminum oxide ($AlO_x$) or tungsten. The connected sacrificial structures 105 include a channel portion 150 and a pillar portion 155. The channel portion 150 of the connected sacrificial structures 105 is vertically adjacent to and extends under the isolated sacrificial structure 110.

The patterning of the sacrificial material forms openings (not shown), into which the support pillar material may be formed, producing the support pillars 115. The support pillar material is selected such that the support pillars 115 provide sufficient strength (e.g., mechanical strength) to support overlying tier pillars 160 (see FIGS. 4A and 4B) in the pillar region 145 of the semiconductor structure 100 following removal of the connected sacrificial structures 105 at a subsequent processing stage. Dimensions of the support pillars 115 may depend on the number and size of the tier pillars 160 to be formed. The support pillars 115 are located in the pillar region 145 in sufficient number and size to support the tier pillars 160 without interfering with contact between a channel material of cell films 165 (see FIGS. 4A and 4B) and the source 135. The support pillars 115 may be formed at a pitch that ranges from between two times and five times, or smaller, of the pitch of the tier openings 170. The support pillars 115 may be formed at a pitch sufficient to provide mechanical stability to the overlying tier pillars 160. The support pillar material may be a conductive material or an insulative material that is compatible with subsequent processing acts and remains following selective removal of the connected sacrificial structures 105. The support pillar material may include, but is not limited to, polysilicon or a silicon oxide, such as silicon dioxide. In some embodiments, the support pillar material is polysilicon.

A portion of the sacrificial material in the slit region 140 may be removed to form a recess (not shown). The oxide material 120 is conformally formed in the recess in the slit region 140 and over the connected sacrificial structures 105 and support pillars 115 in the pillar region 145. The oxide material 120 may, for example, be a $SiO_x$ material. A sacrificial material is formed in the recess in the slit region 140, producing the isolated sacrificial structure 110. The oxide material 120 substantially surrounds sidewalls and a bottom surface of the isolated sacrificial structure 110. The sacrificial material may include, but is not limited to, a $SiO_x$, a metal oxide, such as $AlO_x$ or a metal, such as W, and may be selected to enable selective removal of nitride materials of tiers 180 (FIG. 2A) during subsequent processing acts. The sacrificial material of the isolated sacrificial structure 110 may be the same as or different from the sacrificial material of the connected sacrificial structures 105. If different materials are used, the isolated sacrificial structure 110 and the connected sacrificial structures 105 may be selectively removable relative to one another.

Openings (not shown) are formed in the oxide material 120 proximal to interfaces 175 between the connected sacrificial structures 105 and the support pillars 115. The openings are formed at locations where the optional sacrificial plugs 125 are ultimately to be formed. An optional plug material is formed in the openings to form the sacrificial plugs 125 (e.g., pillar landing pads), as shown in FIGS. 1A and 1B. The sacrificial plugs 125, when present, provide critical dimension (CD) control to formation of the cell films 165 in the tier openings 170. If, however, sufficient CD control is achieved, the sacrificial plugs 125 may not be utilized. The plug material may include, but is not limited to, $AlO_x$, $AlO_x$ doped boron, W, a doped high-K material, such as aluminum- or hafnium-doped magnesium oxide, or a combination thereof. If the materials of the sacrificial plugs 125 and the isolated sacrificial structure 110 are the same, the sacrificial plugs 125 and isolated sacrificial structure 110 may be formed at substantially the same time. As described below, the formation of the sacrificial plugs 125 may help to provide pinch off at the bottom of the tier openings 170 during subsequent processing acts due to variation in CD of the tier openings 170 proximal to the connected sacrificial structures 105. The pinch off enables isolation in a channel transistor string that is formed (e.g., deposited) with ALD oxide from the source during formation of a fill material (e.g., fill material 200). While subsequent drawings show the oxide material 120 present in the slit region 140, the oxide material 120 and the sacrificial plugs 125 are omitted from the pillar region 145 for clarity.

Alternatively, the support pillar material is formed over the insulative material 130 and patterned to form the support pillars 115 and openings (not shown) between the support pillars 115 in the pillar region 145. The sacrificial material may be formed in the openings to form the connected sacrificial structures 105 separated from one another by the support pillars 115. In the slit region 140, the recess (not shown) may be formed before conformally forming the oxide material 120 in the recess and over the connected sacrificial structures 105 and support pillars 115 in the pillar region 145. The isolated sacrificial structure 110 and sacrificial plugs 125 may be formed as described above.

Figure 2A:
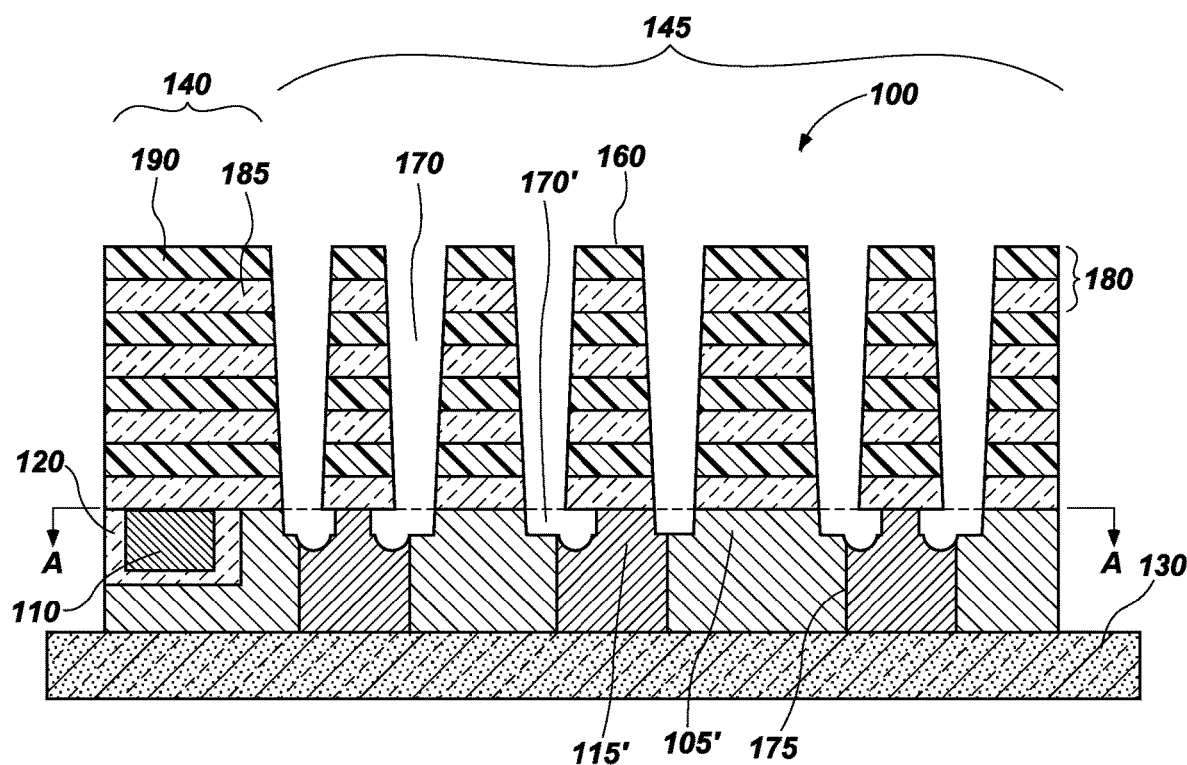
Figure 2B:
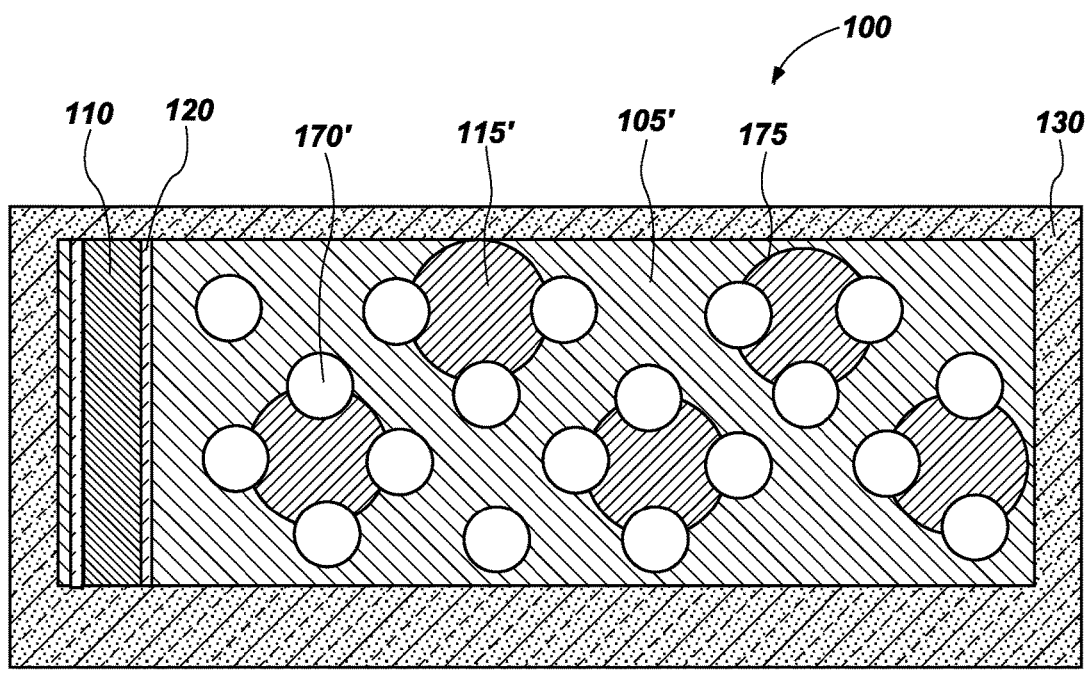

Tiers 180 of alternating dielectric materials 185 and nitride materials 190 are formed over the isolated sacrificial structure 110, the oxide material 120, the connected sacrificial structures 105, and the sacrificial plugs 125, if present, as shown in FIGS. 2A and 2B. The dielectric materials 185 and nitride materials 190 may be formed by conventional techniques. The tiers 180 may be patterned to form the tier pillars 160 and the tier openings 170. A width of the tier openings 170 may range from about 60 nm to about 120 nm, such as from about 60 nm to about 80 nm, from about 80 nm to about 100 nm, or from about 100 nm to about 120 nm. Since the tier openings 170 may be tapered in shape, the width proximal to the support pillars 115 and connected sacrificial structures 105 may be narrower than the width distal to the support pillars 115 and connected sacrificial structures 105. To enable uniform doping of a channel material subsequently formed in the tier openings 170, the tier openings 170 are formed over the interfaces 175, such that a portion of both the support pillars 115 and the connected sacrificial structures 105 is exposed through the tier openings 170. In FIG. 2B, the dielectric materials 185 and nitride materials 190 of the tiers 180, the oxide material 120 in the pillar region 145, and the sacrificial plugs 125 have been removed for clarity. Therefore, the top down view in FIG. 2B illustrates the perspective along cross-section line A-A of FIG. 2A. The materials of the tiers 180 are removed to expose top surfaces of the connected sacrificial structures 105 and the support pillars 115, as shown by the dashed lines. The materials of the tiers 180 are removed by a first etch process, such as by a dry etch process.

A second etch process may then be conducted to remove exposed portions (e.g., partially remove) of the connected sacrificial structures 105 and the support pillars 115 adjacent to the interfaces 175, forming tier openings 170' and support pillars 115'. The tier openings 170' extend into the connected sacrificial structures 105 and the support pillars 115', with some of the tier openings 170' surrounded by the connected sacrificial structures 105, and other of the tier openings 170' surrounded by the connected sacrificial structures 105 and the support pillars 115'. The second etch process may, for example, be a wet etch process, and the materials removed to form connected sacrificial structures 105' and the support pillars 115'. Appropriate etch chemistries for removing the materials may be determined by a person of ordinary skill in the art. Since the tiers 180 remain over the isolated sacrificial structure 110, no portion of the isolated sacrificial structure 110 is removed at this fabrication stage. As described below, the resulting profile of the connected sacrificial structures 105' and support pillars 115' enables uniform doping of cell films 165 (see FIGS. 4A and 4B) subsequently formed in the tier openings 170'.

The dielectric material 185 of the tiers 180 may include, but is not limited to, a silicon oxide ($SiO_x$), such as silicon dioxide ($SiO_2$), phosphosilicate glass, borosilicate glass, borophosphosilicate glass, fluorosilicate glass, titanium dioxide, zirconium dioxide, hafnium dioxide, tantalum oxide, magnesium oxide, aluminum oxide, or a combination thereof. The nitride material 190 may include, but is not limited to, a silicon nitride (SiN). In some embodiments, the dielectric material 185 is $SiO_2$, and the nitride material 190 is SiN.

Figure 3A:
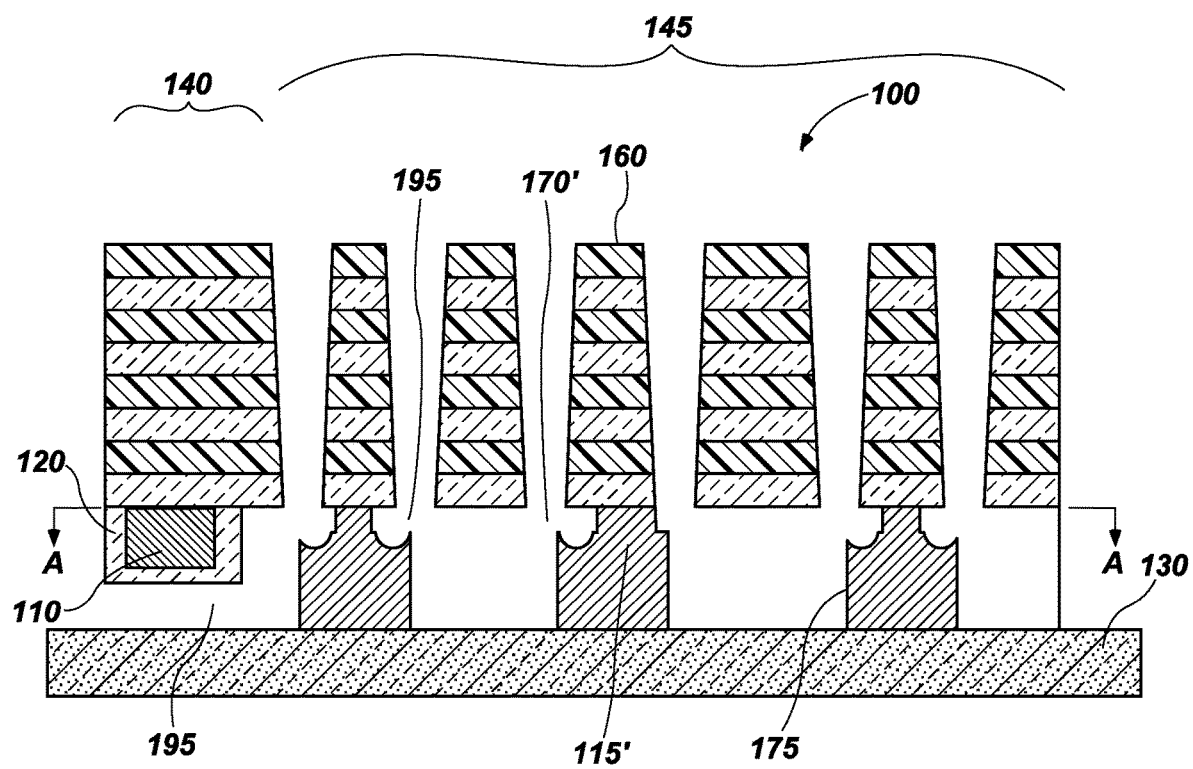
Figure 3B:
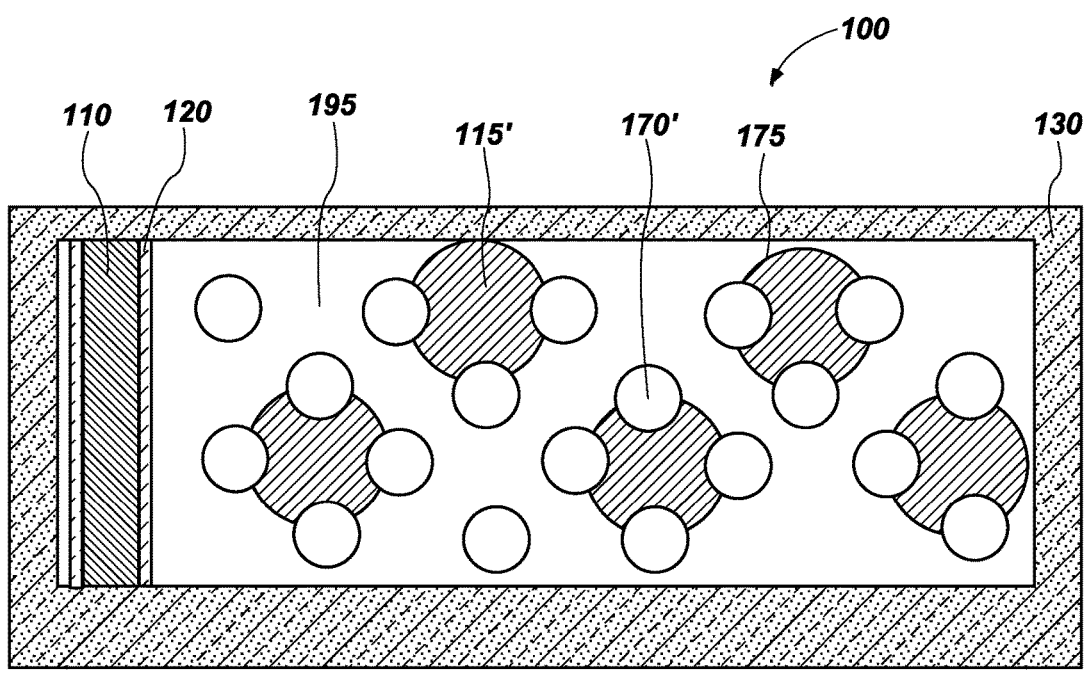

As shown in FIGS. 3A and 3B, the connected sacrificial structures 105' may be removed (e.g., exhumed) to form cavity 195. Substantially all of the connected sacrificial structures 105' are removed from the pillar region 145, while the isolated sacrificial structure 110 in the slit region 140 remains protected by the tiers 180. The channel portion 150 of the connected sacrificial structures 105' is also removed, extending the cavity 195 under the isolated sacrificial structure 110. The connected sacrificial structures 105' may be removed by an etch chemistry that selectively removes the sacrificial material without removing the pillar support material. The connected sacrificial structures 105' are removed, for example, by a wet etch process. Following the removal of the connected sacrificial structures 105', a portion of the cavity 195 is located below the pillar region 145 while another portion of the cavity 195 extends below the isolated sacrificial structure 110 in the slit region 140. The support pillars 115' remaining in the pillar region 145 provide sufficient mechanical stability and integrity to support the tier pillars 160 after removal of the connected sacrificial structures 105'. In FIG. 3B, the dielectric materials 185 and nitride materials 190 of the tiers 180, the oxide material 120 in the pillar region 145, and the sacrificial plugs 125 have been removed for clarity. Therefore, the top down view in FIG. 3B illustrates the perspective along cross-section line A-A of FIG. 3A.

Dimensions of the cavity 195 may be sufficient to contain a conductive material that functions as the source 135. The dimensions of the cavity 195 may be determined by resistance requirements of the source 135 and are scalable by adjusting (e.g., increasing, decreasing) a height (e.g., a thickness) at which the connected sacrificial structures 105 and the support pillars 115 are initially formed. By way of example only, the sacrificial material and the support pillar material may be formed at a thickness of from about 2000 Å to about 2500 Å. As described below, the source 135 may be substantially completely filled with the conductive material to achieve the desired resistance requirements.

Figure 4A:
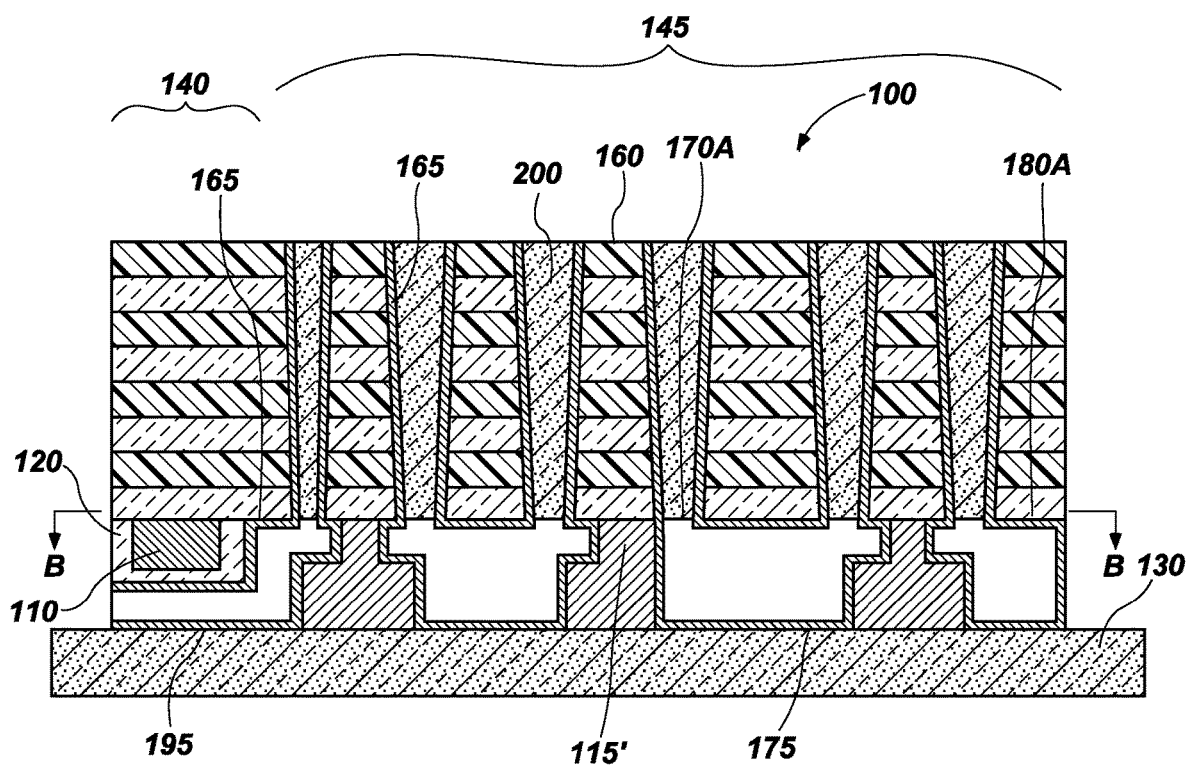
Figure 4B:
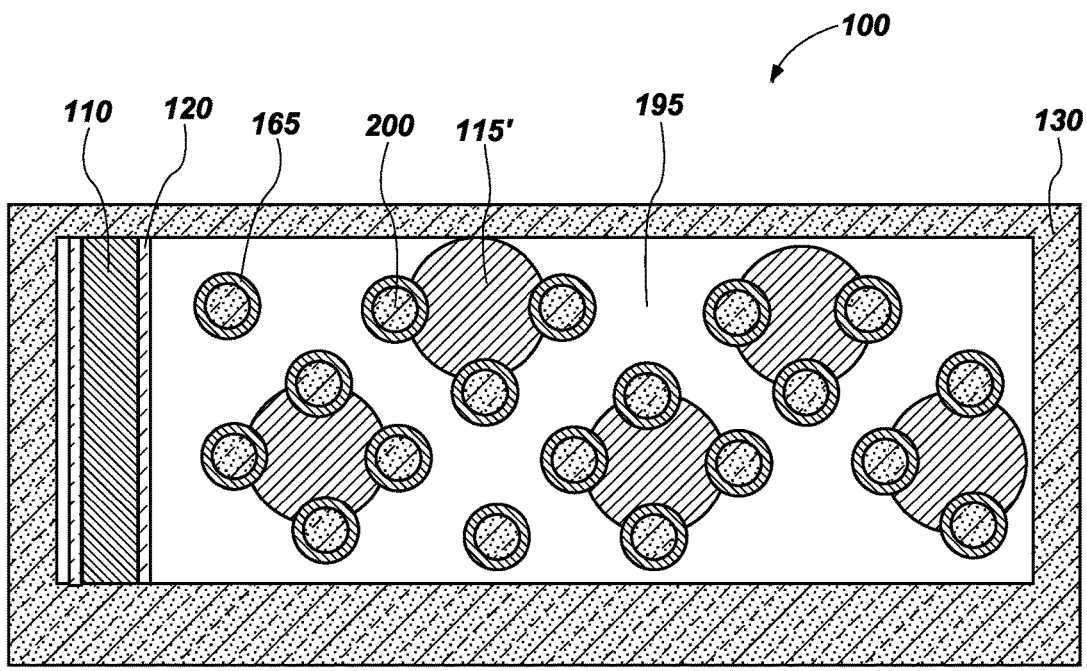

The cell film 165 is formed in the tier openings 170 and in the cavity 195, as shown in FIGS. 4A and 4B. The cell film 165 may include a cell material formed within the tier openings 170, and a channel material formed over the cell material. For convenience, the cell material and channel material are illustrated as a single material (e.g., the cell film 165) in FIGS. 4A and 4B. However, the cell film 165 is understood to include both the cell material and the channel material. The cell material and channel material are formed by conventional techniques, such as by CVD or ALD. The cell material may, for example, be an oxide-nitride-oxide (ONO) material, such as a silicon oxide-silicon nitride-silicon oxide material, that is conformally formed over sidewalls of the tier pillars 160 and over surfaces of the cavity 195 in the slit region 140 and in the pillar region 145. The cavity 195 is defined by surfaces of the support pillars 115' and a bottom surface of the lowermost tier 180A. The cell material may be formed at a smaller relative thickness than the channel material. The channel material may be conformally formed over the cell material. The channel material may, for example, be polysilicon. As the formation of the channel material in the tier openings 170 and cavity 195 progresses, a portion of the tier openings 170 proximal to the cavity 195 may become substantially completely filled, forming so-called "pinched off" portions 170A above the cavity 195. The sacrificial plugs 125 (see FIGS. 1A and 1B), when present, positioned proximal to the cavity 195 also contribute to the pinching-off within the tier openings 170. The amount (e.g., thickness) of the cell materials and channel material in the cavity 195 before the tier openings 170 becomes pinched off, may be sufficient to provide electrical contact between the cell films 165 and source 135.

A fill material 200 may be formed over the channel material, substantially filling the tier openings 170. The fill material 200 is an insulative material, such as a high quality silicon oxide material. For example, the fill material 200 may be a highly uniform and highly conformal silicon oxide material (e.g., a highly uniform and highly conformal silicon dioxide material). The fill material 200 may be highly uniform and highly conformal as deposited. The fill material 200 may be formed by conventional techniques, such as by ALD. In some embodiments, the fill material 200 is an ALD SiO$_x$. The fill material 200 may initially be formed in the tier openings 170 and over exposed horizontal surfaces of the tiers 180, with the fill material 200 over the tiers 180 subsequently removed, such as by an abrasive planarization process (e.g., chemical mechanical planarization (CMP)). Since the tier openings 170 are pinched off proximal to the cavity 195, substantially no fill material 200 forms in the cavity 195. If, however, a small amount of the fill material 200 enters in the cavity 195, the fill material 200 may be removed before completing the source 135. In FIG. 4B, the dielectric materials 185 and nitride materials 190 of the tiers 180, the oxide material 120 in the pillar region 145, and the sacrificial plugs 125 have been removed for clarity. However, the fill material 200 and the cell film 165 are illustrated. Therefore, the top down view in FIG. 4B illustrates the perspective along cross-section line B-B of FIG. 4A. The fill material 200 in the tier openings 170 is surrounded by the cell material and the channel material of the cell film 165.

Figure 5A:
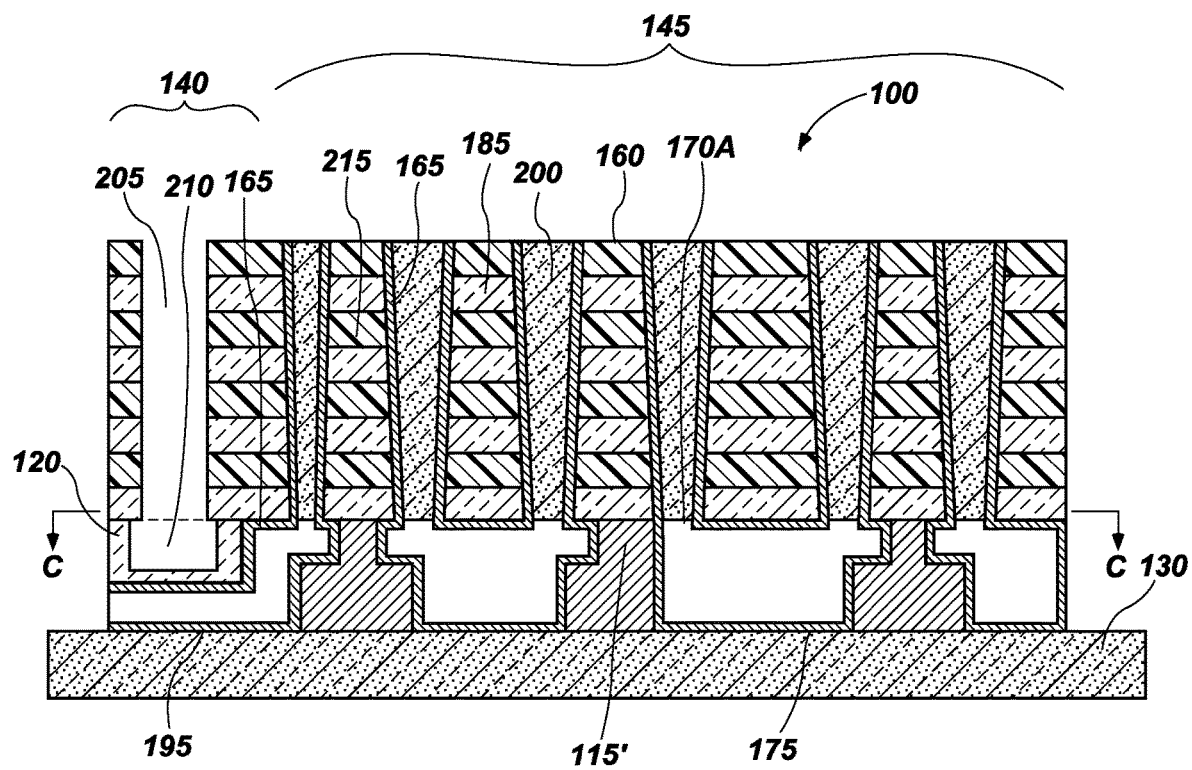
Figure 5B:
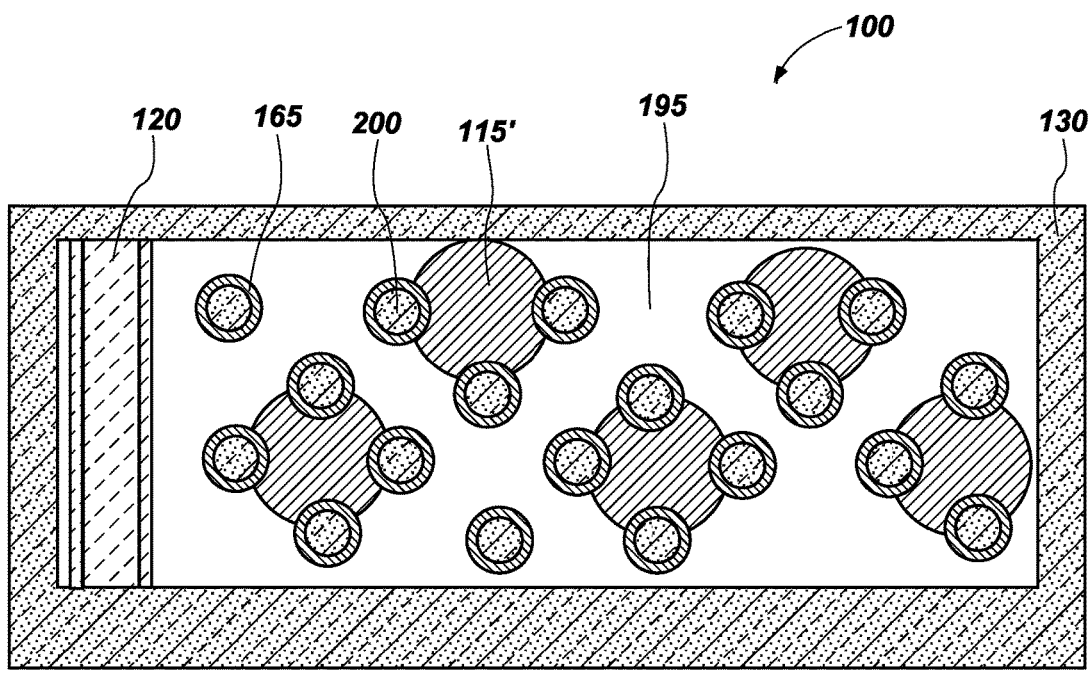

A slit 205 is formed in the slit region 140 by removing a portion of the tiers 180 overlying the isolated sacrificial structure 110, as shown in FIGS. 5A and 5B. The portion of the dielectric materials 185 and nitride materials 190 of the tiers 180 is removed to expose a top surface of the isolated sacrificial structure 110, as shown by the dashed line in FIG. 5A. The isolated sacrificial structure 110, therefore, functions as an etch stop. The slit 205 is formed by conventional techniques. The isolated sacrificial structure 110 is then removed, exposing sidewalls and a bottom horizontal surface of the oxide material 120 and forming source opening 210. The isolated sacrificial structure 110 is removed by conventional techniques. The nitride materials 190 of the tiers 180 are then selectively removed and conductive materials 215 formed in the resulting spaces. The removal of the nitride materials 190 and replacement with the conductive materials 215 is conducted by a so-called "replacement gate" process. The nitride materials 190 may be removed, such as by a wet etch process (e.g., an isotropic etch process), that utilizes an etch chemistry selective for the nitride materials 190 relative to the dielectric materials 185 of the tiers 180 and the oxide material 120. Some of the conductive materials 215 of the tiers 180 correspond to word lines (e.g., access lines) of the memory cells and other of the conductive materials 215 of the tiers 180 correspond to select gate sources/select gate drains of the memory cells. In FIG. 5B, the dielectric materials 185 and conductive materials 215 of the tiers 180, the oxide material 120 in the pillar region 145, and the sacrificial plugs 125 have been removed for clarity. However, the fill material 200 and cell film 165 are illustrated. Therefore, the top down view in FIG. 5B illustrates the perspective along cross-section line C-C of FIG. 5A. While one slit 205 is shown in FIGS. 5A and 5B, an additional slit(s) may be present for between every additional four tier openings 170 and nine tier openings 170 in the tiers 180.

The conductive materials 215 may be a metal (e.g., tungsten, titanium, molybdenum, niobium, vanadium, hafnium, tantalum, chromium, zirconium, iron, ruthenium, osmium, cobalt, rhodium, iridium, nickel, palladium, platinum, copper, silver, gold, aluminum), a metal alloy (e.g., a cobalt-based alloy, an iron-based alloy, a nickel-based alloy, an iron- and nickel-based alloy, a cobalt- and nickel-based alloy, an iron- and cobalt-based alloy, a cobalt- and nickel- and iron-based alloy, an aluminum-based alloy, a copper-based alloy, a magnesium-based alloy, a titanium-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped silicon, conductively-doped germanium, conductively-doped silicon germanium), or a combination thereof. The conductive materials 215 may be formed by conventional techniques. In some embodiments, the conductive materials 215 are polysilicon.

FIG. 5B illustrates one configuration of the support pillars 115', the fill material 200, and the cell film 165. However, other configurations are possible, examples of which are shown in FIGS. 5B1-5B6. FIGS. 5B1-5B6 illustrate the support pillars 115', the fill material 200, and the cell film 165 in the pillar region 145 and do not illustrate the slit region 140.

Figure 6A:
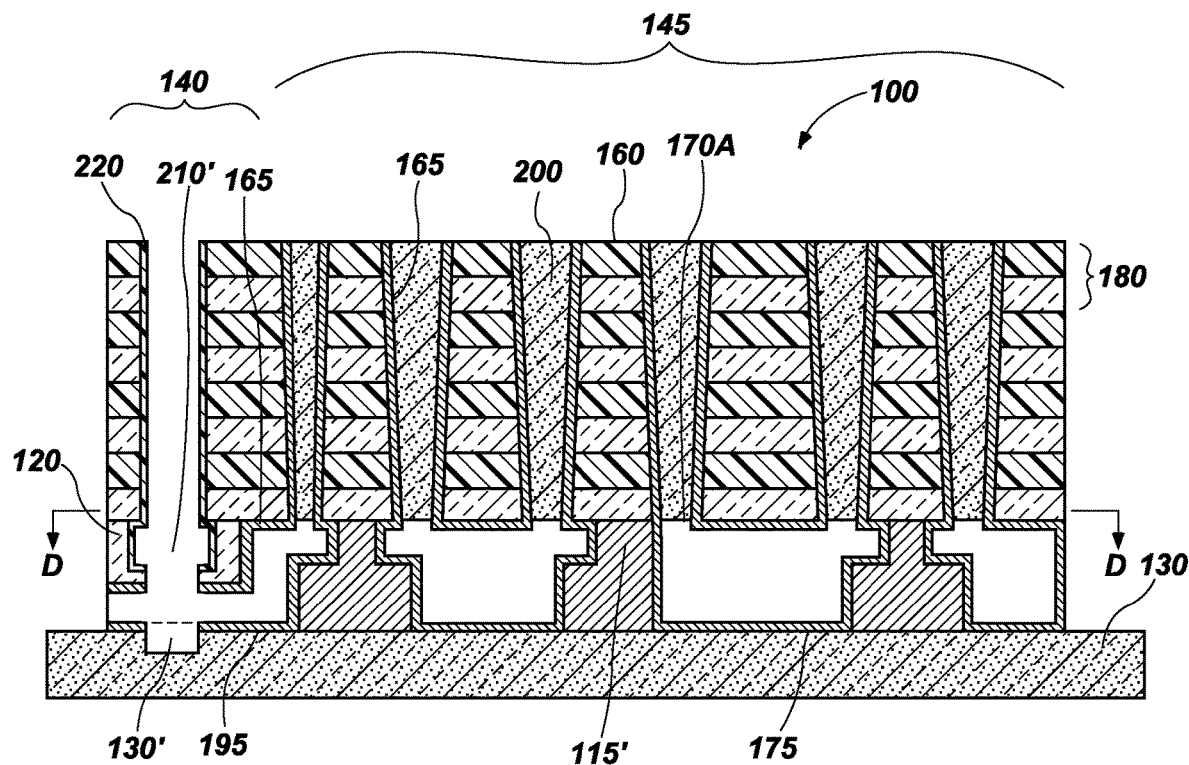
Figure 6B:
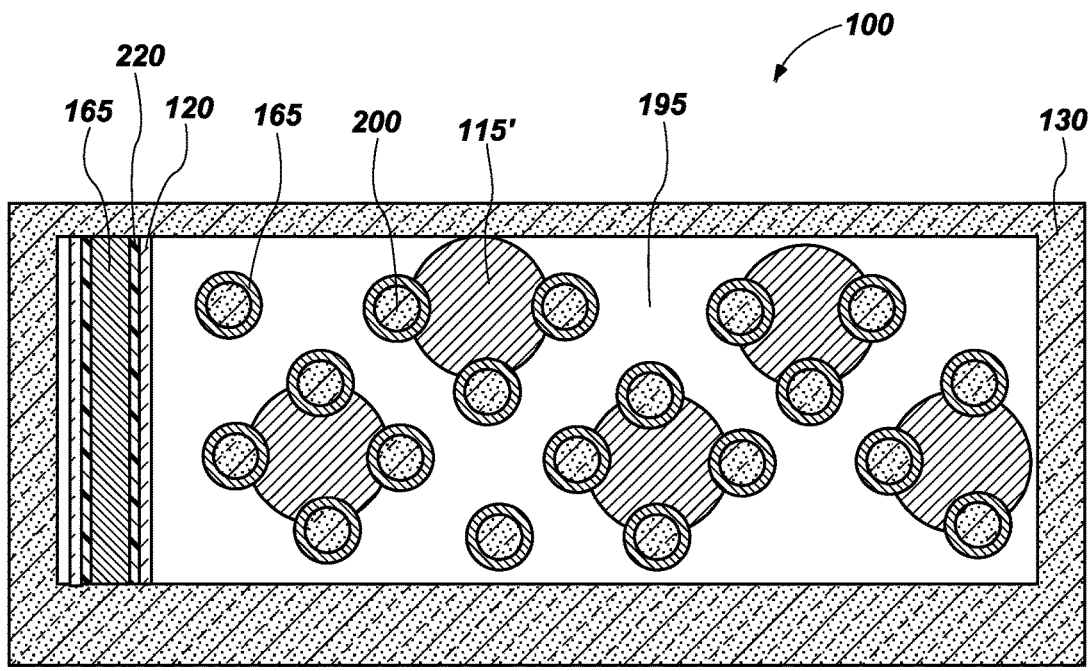

As shown in FIGS. 6A and 6B, an oxide liner 220 is formed on sidewalls of the slit 205 and on sidewalls and a bottom horizontal surface of the oxide material 120. If the fill material 200 is formed in the cavity 195 during an earlier processing stage, the oxide liner 220 may include polysilicon material over the oxide liner 220. A portion of the oxide liner 220 on the bottom horizontal surface is removed, along with the underlying oxide material 120 and the cell film 165 at a top surface of the cavity 195, extending the source opening 210 into the cavity 195 and forming source opening 210'. The oxide liner 220, oxide material 120, and cell film 165 may be removed by conventional techniques. The source opening 210' may connect to the cavity 195 and expose the cell film 165 in the portion of the cavity 195 initially located below the isolated sacrificial structure 110. The source opening 210' and the cavity 195 may be filled with the conductive material, as described below, forming the source 135. To connect to power, the cell film 165 on the opposing, bottom surface of the cavity 195 may also be removed, along with an underlying portion of the insulative material 130, as shown in FIG. 6A. The dashed line in FIG. 6A indicates one possible lower boundary of the source 135, while another possible lower boundary of the source 135 is indicated by the recessed portion 130' of the insulative material 130. In FIG. 6B, the dielectric materials 185 and conductive materials 215 of the tiers 180, the oxide material 120 in the pillar region 145, and the sacrificial plugs 125 have been removed for clarity. However, the fill material 200 and the cell film 165 are illustrated. Therefore, the top down view in FIG. 6B illustrates the perspective along cross-section line D-D of FIG. 6A.

Figure 7A:
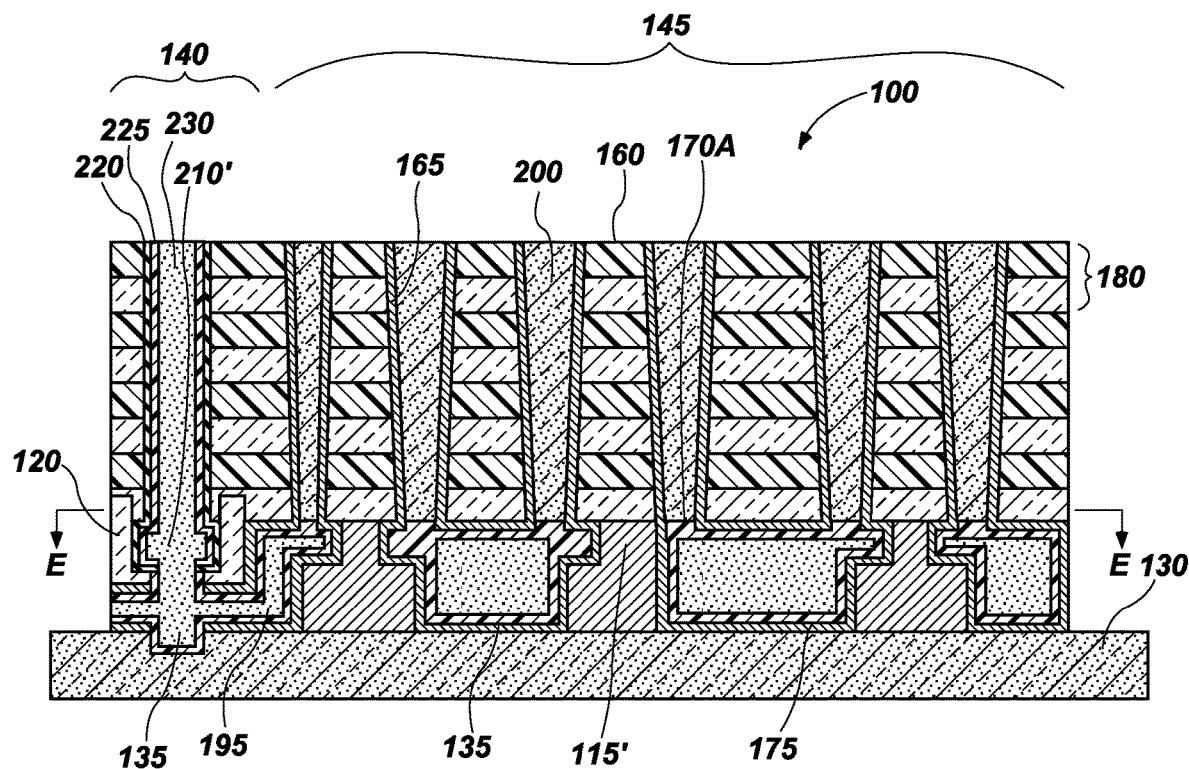
Figure 7B:
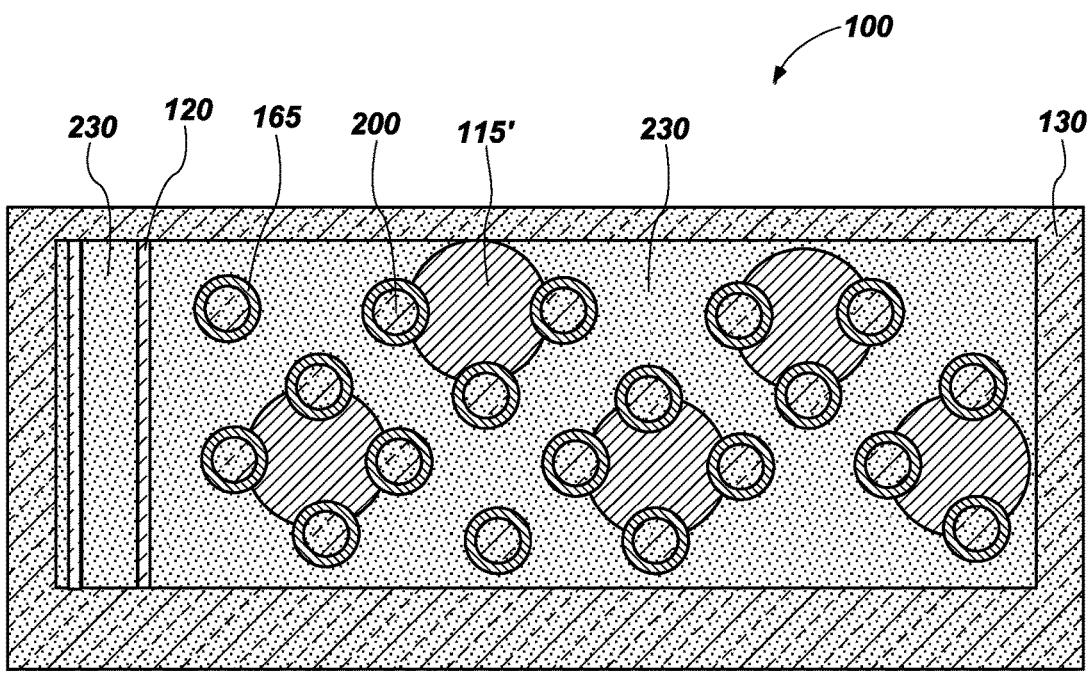

As shown in FIGS. 7A and 7B, a doped polysilicon material 225 is formed over the oxide liner 220 in the slit 205, over the oxide liner 220 and the oxide material 120 in the source opening 210', and over the cell film 165 in the cavity 195. The doped polysilicon material 225 may, for example, include n+ doped polysilicon. The doped polysilicon material 225 may be formed over the channel material of the cell films 165 in the cavity 195. The doped polysilicon material 225 of the source 135 may enable uniform doping of the cell film 165 in the tier openings 170. The dopant may diffuse from the source 135 and up the channel portion of the cell films 165, forming n+ doped regions. Since the cell films 165 are formed in the tier openings 170 above the interfaces 175, the doping profile of the cell films 165 in each of the tier openings 170 may be substantially the same as one another as the dopant diffuses from the doped polysilicon material 225 and into the cell films 165 during use and operation. The dopant uniformly diffuses from the doped polysilicon material 225 and into the cell films 165, such that the cell films 165 become uniformly doped.

A conductive material 230, such as a metal-containing material, polysilicon, or other conventional material, is formed over the doped polysilicon material 225 in the remainder of the slit 205 and cavity 195, forming the source 135. The conductive material 230 may include, but is not limited to, a tungsten-containing material, a titanium-containing material, or a combination thereof. The conductive material 230 may, for example, include a silicided metal material, such as a silicided tungsten ($WSi_x$) material. In some embodiments, the conductive material 230 is tungsten. In other embodiments, the conductive material 230 is $WSi_x$. The source 135, therefore, includes the doped polysilicon material 225 and the conductive material 230 in the cavity 195 and in the source opening 210'. The doped polysilicon material 225 and the conductive material 230 substantially completely fill the slit 205 and cavity 195. The slit 205 and the cavity 195 may be substantially free of voids (e.g., air gaps) following the formation of the conductive material 230.

While the conductive material 230 is illustrated in FIGS. 7A and 7B as being formed of a single material, a person of ordinary skill in the art would understand that the metal-containing material may also include a liner material, such as titanium nitride (TiN), tungsten nitride (WN), or a combination (e.g., a laminate) of titanium and TiN, under the metal-containing material. For example, titanium may be formed over the doped polysilicon material 225, followed by forming titanium silicide over the titanium. The TiN and tungsten may then be formed over the titanium silicide. Any doped polysilicon material 225 or conductive material 230 formed over the tiers 180 in the pillar region 145 may be removed, such as by CMP, to isolate connections to the source 135 to the center of the slit 205 containing the conductive material 230. The slit 205, therefore, is utilized in embodiments of the disclosure to form the source 135 as well as to form the conductive materials 215 in the tiers 180 using the replacement gate process.

The source 135 is positioned below the tiers 180 and the cell films 165 in the tier openings 170 and above the insulative material 130. Therefore, the source 135 does not come into contact with the cell films 165 in the tier openings 170. The source 135 is surrounded by the cell material and the channel material of the cell film 165, with the conductive material 230 in the slit region 140 electrically connected to the conductive material 230 of the source 135. The conductive material 230 of the source 135 is also in electrical contact with the channel material of the cell film 165 in the tier openings 170. The doped polysilicon material 225 and the conductive material 230 in the slit region 140 and in the source opening 210' are configured to charge the source 135 during use and operation. In FIG. 7B, the dielectric materials 185 and conductive materials 215 of the tiers 180, the oxide material 120 in the pillar region 145, and the sacrificial plugs 125 have been removed for clarity. However, the fill material 200, the cell film 165, and the conductive material 230 are illustrated. Therefore, the top down view in FIG. 7B illustrates the perspective along cross-section line E-E of FIG. 7A.

Since the source 135 in the cavity 195 is surrounded by the cell film 165, no pillar punch etch process is necessary to connect the cell material and channel material of the cell film 165 in the tier openings 170 to the source 135. The reliability and reproducibility of contact between the cell films 165 in the tier openings 170 and the source 135 is, therefore, improved, along with cell performance. Since no pillar punch etch process is conducted, multiple decks of tiers 180 may be formed on top of one another and aligned without causing alignment problems, even when the cell films 165 are formed in high aspect ratio (HAR) openings, such as tier openings 170 having an aspect ratio of at least about 20:1, at least about 40:1, at least about 50:1, at least about 60:1, at least about 80:1, or at least about 100:1. By way of example only, two or more aligned decks of tiers 180 may be formed on top of one another, such as three decks of tiers 180, four decks of tiers 180, or five or more decks of tiers 180. Therefore, conducting the pillar punch etch process is not needed even as dimensions of the tier openings 170 continue to be scaled down. In addition, the cell films 165 may be formed in substantially all of the tier openings 170 at the same time, compared to conventional processes where up to one-third of the cell films 165 are formed at a single time.

Accordingly, a method of forming a semiconductor device is disclosed. The method comprises forming sacrificial structures and support pillars on a material. The sacrificial structures comprise an isolated sacrificial structure in a slit region and connected sacrificial structures in a pillar region. Tiers are formed over the sacrificial structures and support pillars, with a portion of the tiers overlying the isolated sacrificial structure in the slit region and another portion of the tiers overlying the connected sacrificial structure in the pillar region. The another portion of the tiers in the pillar region are removed to form tier pillars and tier openings and to expose the connected sacrificial structures and support pillars. The connected sacrificial structures are removed to form a cavity, with a portion of the cavity extending below the isolated sacrificial structure. A cell film is formed over sidewalls of the tier pillars and over sidewalls of the cavity. A fill material is formed in the tier openings and over the cell film. The portion of the tiers in the slit region is removed to expose the isolated sacrificial structure and the isolated sacrificial structure is removed to form a source opening. The source opening is connected to the cavity and a conductive material is formed in the source opening and in the cavity to form a source.

While FIGS. 1A-7B describe and illustrate the fabrication of a 3D NAND Flash memory device formed by a replacement gate process, embodiments of the disclosure may be used to form a 3D NAND Flash memory device by a floating gate process, where the conductive materials 215 are present initially in place of the nitride materials 190 of the replacement gate process. In the floating gate process, the tiers 180 (see FIGS. 2A and 2B) include alternating dielectric materials 185 and conductive materials 215 instead of the alternating dielectric materials 185 and nitride materials 190. Therefore, in the process stage illustrated in FIGS. 2A and 2B, the conductive materials 215 are present at this stage instead of the nitride materials 190. The alternating dielectric materials 185 and conductive materials 215 are formed by conventional techniques.

Semiconductor devices including the source 135 formed in accordance with embodiments of the disclosure may be formed by conducting additional process acts, which are not described in detail herein.

Figure 8:
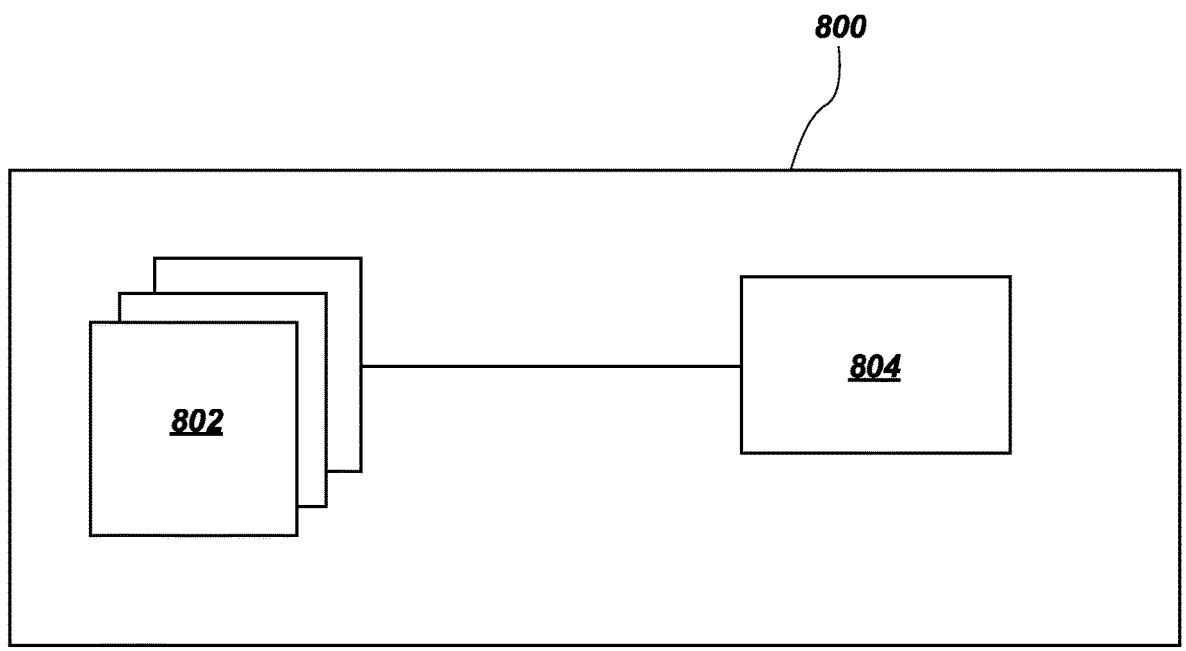
FIG. 8 is a schematic block diagram illustrating the semiconductor device comprising the source in accordance with embodiments of the disclosure.

A semiconductor device, such as a memory device 800, is also disclosed, as shown schematically in FIG. 8. The memory device 800 includes a memory array 802 of memory cells including the source 135 according to embodiments of the disclosure and a control logic component 804.

The control logic component 804 may be configured to operatively interact with the memory array 802 so as to read, write, or re-fresh any or all memory cells within the memory array 802. The memory device 800 includes the memory array 802 formed over and electrically coupled to the source 135. The memory cells are coupled to access lines (e.g., word lines), and the access lines are coupled to control gates of the memory cells. A string of memory cells of the memory array 802 is coupled in series between a source line and a data line (e.g. a bit line).

Accordingly, a semiconductor device comprising a source and memory cells is disclosed. The memory cells comprise tiers of alternating dielectric materials and conductive materials adjacent to pillars comprising a cell film. The source is below the memory cells and surrounded by the cell film of the pillars.

Figure 9:
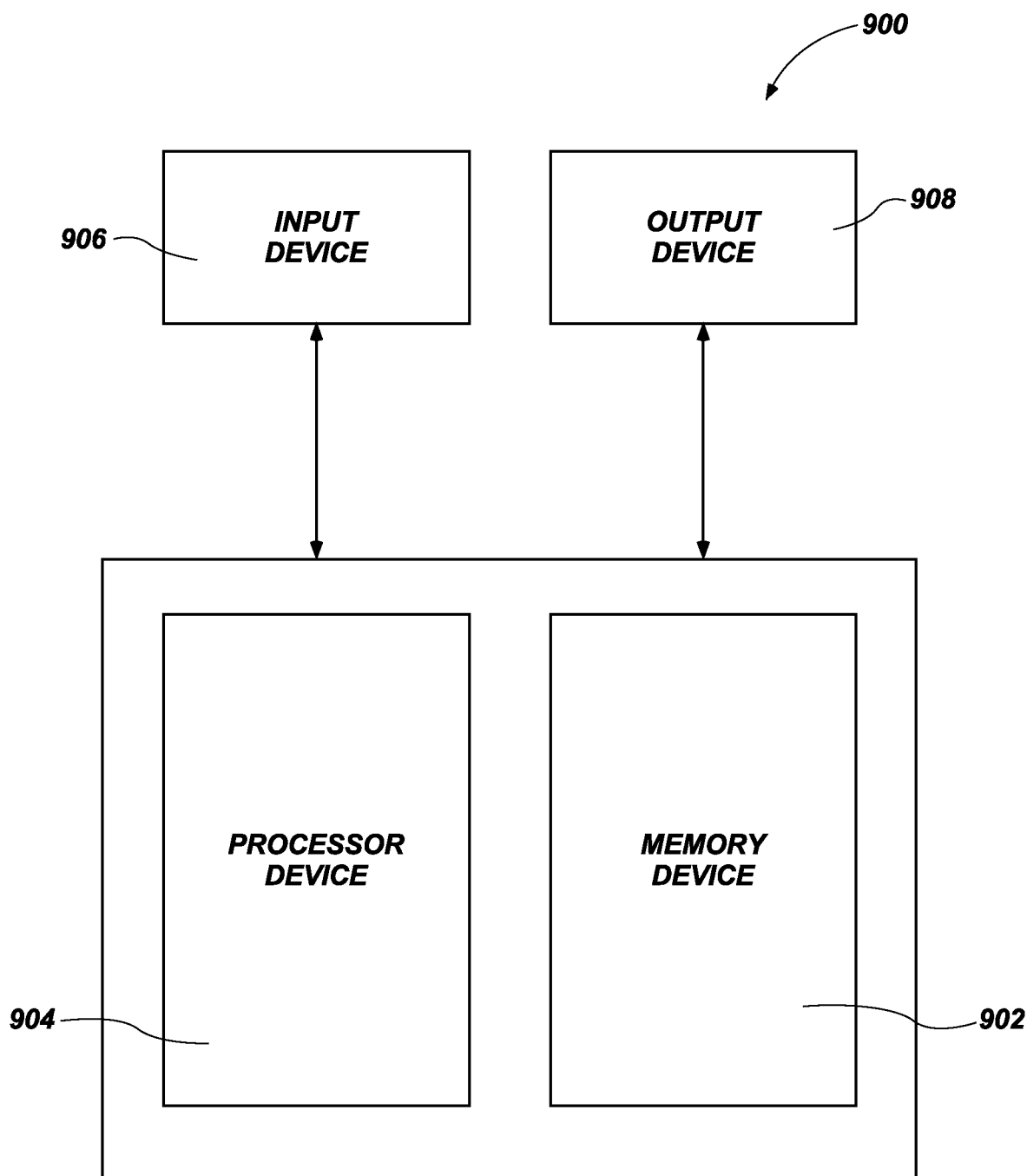
FIG. 9 is a schematic block diagram illustrating a system including semiconductor devices comprising the source in accordance with embodiments of the disclosure.

A system 900 is also disclosed, as shown in FIG. 9, and includes at least one source 135 according to embodiments of the disclosure. FIG. 9 is a simplified block diagram of the system 900 implemented according to one or more embodiments described herein. The system 900 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The system 900 includes at least one memory device 902, which includes memory cells coupled to the source 135 as previously described. The system 900 may further include at least one processor device 904 (often referred to as a "processor"). The processor device 904 may, optionally, include at least one source 135 as previously described. The system 900 may further include one or more input devices 906 for inputting information into the system 900 by a user, such as, for example, a mouse or other pointing device, a keyboard, a touchpad, a button, or a control panel. The system 900 may further include one or more output devices 908 for outputting information (e.g., visual or audio output) to a user such as, for example, a monitor, a display, a printer, an audio output jack, a speaker, etc. In some embodiments, the input device 906 and the output device 908 may comprise a single touchscreen device that can be used both to input information to the system 900 and to output visual information to a user. The one or more input devices 906 and output devices 908 may communicate electrically with at least one of the memory device 902 and the processor device 904. The at least one memory device 902 and processor device 904 may also be used in a system on chip (SoC).

Accordingly, a system comprising a source electrically connected to an array of memory cells is disclosed. The source is positioned below the memory cells and surrounded by a cell film contained within pillars of the memory cells. A processor is in operative communication with at least one input device, at least one output device, and the memory cells.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method of forming a semiconductor device, comprising:
   forming sacrificial structures and support pillars on a material, the sacrificial structures comprising an isolated sacrificial structure in a slit region and connected sacrificial structures in a pillar region;
   forming tiers over the sacrificial structures and support pillars, a portion of the tiers overlying the isolated sacrificial structure in the slit region and another portion of the tiers overlying the connected sacrificial structures in the pillar region;
   removing the portion of the tiers in the pillar region to form tier pillars and tier openings and to expose the connected sacrificial structures and support pillars;
   removing the connected sacrificial structures to form a cavity, a portion of the cavity extending below the isolated sacrificial structure;
   forming a cell film over sidewalls of the tier pillars and over sidewalls of the cavity;
   forming a fill material in the tier openings and over the cell film;
   removing the portion of the tiers in the slit region to expose the isolated sacrificial structure;
   removing the isolated sacrificial structure to form a source opening;
   connecting the source opening to the cavity; and
   forming a conductive material in the source opening and in the cavity to form a source.

2. The method of claim 1, wherein forming sacrificial structures and support pillars on a material comprises forming the sacrificial structures comprising aluminum oxide or tungsten.

3. The method of claim 1, wherein forming sacrificial structures and support pillars on a material comprises forming the support pillars comprising polysilicon.

4. The method of claim 1, wherein forming tiers over the sacrificial structures and support pillars comprises forming alternating dielectric material and nitride materials over the sacrificial structures and support pillars.

5. The method of claim 1, wherein forming tiers over the sacrificial structures and support pillars comprises forming alternating dielectric material and conductive materials over the sacrificial structures and support pillars.

6. The method of claim 1, wherein removing the connected sacrificial structures to form a cavity comprises forming the cavity defined by surfaces of the support pillars and surfaces of the tiers.

7. The method of claim 1, wherein removing the connected sacrificial structures to form a cavity comprises forming a portion of the cavity in the slit region and a portion of the cavity in the pillar region.

8. The method of claim 1, wherein forming a cell film over sidewalls of the tier pillars and over sidewalls of the cavity comprises forming a cell material over the sidewalls of the tier pillars and over the sidewalls of the cavity and forming a channel material over the cell material.

9. The method of claim 1, wherein forming a fill material in the tier openings comprises substantially completely filling the tier openings without forming the fill material in the cavity.

10. The method of claim 1, wherein forming a fill material in the tier openings comprises forming the fill material by atomic layer deposition.

11. The method of claim 1, further comprising forming an oxide material between the isolated sacrificial structure and the connected sacrificial structures.

12. The method of claim 11, wherein connecting the source opening to the cavity comprises removing a portion of the oxide material below the isolated sacrificial structure.

13. The method of claim 1, wherein forming a conductive material in the source opening and in the cavity to form a source comprises forming the source without conducting a pillar etch punch act to remove a portion of the cell film.

14. The method of claim 1, wherein forming a conductive material in the source opening and in the cavity to form a source comprises forming the source surrounded by the cell film.

15. The method of claim 1, wherein removing the portion of the tiers in the slit region to expose the isolated sacrificial structure comprises forming a slit in the slit region and wherein forming a conductive material in the source opening and in the cavity comprises forming the conductive material in the slit, in the source opening, and in the cavity.

16. The method of claim 15, further comprising removing nitride materials of the tiers through the slit.

17. The method of claim 1, wherein forming a conductive material in the source opening and in the cavity to form a source comprises forming a doped polysilicon material in the source opening and in the cavity and forming a conductive material over the doped polysilicon material.

18. A semiconductor device, comprising:
   memory cells comprising tiers of alternating dielectric materials and conductive materials adjacent to pillars comprising a cell film; and
   a source below the memory cells and surrounded by the cell film of the pillars.

19. The semiconductor device of claim 18, wherein the cell film comprises a cell material and a channel material.

20. The semiconductor device of claim 19, wherein the source comprises a doped polysilicon material over the cell material and the channel material.

21. The semiconductor device of claim 20, wherein the source comprises a first conductive material over the doped polysilicon material.

22. The semiconductor device of claim 18, wherein the pillars comprise an aspect ratio of greater than about 40:1.

23. The semiconductor device of claim 18, wherein the source is electrically coupled to a second conductive material in a slit region of the memory device.

24. The semiconductor device of claim 18, wherein the source is below the tiers of alternating dielectric materials and conductive materials.

25. A system comprising:
   a source electrically connected to an array of memory cells, the source positioned below the memory cells and surrounded by a cell film contained within pillars of the memory cells; and
   a processor in operative communication with at least one input device, at least one output device, and the memory cells.

26. The system of claim 25, wherein the source comprises a tungsten-containing material, a titanium-containing material, or a combination thereof.

27. The system of claim 25, wherein the source comprises $WSi_x$.

* * * * *